US010785603B2

(12) United States Patent
Breedvelt-Schouten et al.

(10) Patent No.: US 10,785,603 B2
(45) Date of Patent: *Sep. 22, 2020

(54) DETERMINING LOCATIONS BASED ON DYNAMIC ENVIRONMENTAL CHARACTERISTICS AND USER DATA

(71) Applicant: International Business Machines Corporation, Armonk, NY (US)

(72) Inventors: Ilse Breedvelt-Schouten, Manotick (CA); Jana H. Jenkins, Raleigh, NC (US); Jeffrey A. Kusnitz, Campbell, CA (US); John A. Lyons, Ottawa (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/523,043

(22) Filed: Jul. 26, 2019

(65) Prior Publication Data
US 2020/0137523 A1    Apr. 30, 2020

Related U.S. Application Data

(63) Continuation of application No. 16/176,020, filed on Oct. 31, 2018.

(51) Int. Cl.
*H04W 24/00* (2009.01)
*H04W 4/029* (2018.01)
(Continued)

(52) U.S. Cl.
CPC ............ *H04W 4/029* (2018.02); *G06F 30/20* (2020.01); *G06N 20/00* (2019.01)

(58) Field of Classification Search
CPC .. H04L 29/08108; H04W 4/02; H04W 48/04; H04W 64/00
(Continued)

(56) References Cited

U.S. PATENT DOCUMENTS

| 7,486,201 B2 * | 2/2009 | Kelly ................. G01C 21/3694 340/905 |
| 8,781,801 B2 | 7/2014 | Takahashi et al. |

(Continued)

FOREIGN PATENT DOCUMENTS

| CN | 103514626 A | 4/2016 |
| WO | WO2017/133093 A1 | 8/2017 |

OTHER PUBLICATIONS

List of IBM Patents or Patent Applications Treated as Related (Appendix P), 2 pages.

(Continued)

*Primary Examiner* — Matthew W Genack
(74) *Attorney, Agent, or Firm* — Francis Lammes; Stephen J. Walder, Jr.; Alexander Jochym

(57) ABSTRACT

Mechanisms are provided to implement a location identification mechanism to identify a location or route for a user. A starting location of the user is identified in response to receiving a set of details from the user including at least a target location. A three-dimensional model of an area around the starting location, an area around the target location, and an area between the starting location and the target location is generated and current local weather and forecasted local weather associated with the starting location, the target location, and the area between the starting location and the target location is identified. Anticipated wind flow and temperatures within the generated three-dimensional model are simulated to identify a route from the starting location to the target location that meets a set of personal preferences of the user. The identified route is then presented on a user-selected navigation application.

6 Claims, 3 Drawing Sheets

(51) Int. Cl.
  *G06N 20/00* (2019.01)
  *G06F 30/20* (2020.01)
(58) Field of Classification Search
  USPC ............ 455/414.1–414.4, 456.1–456.6, 457
  See application file for complete search history.

(56) References Cited

U.S. PATENT DOCUMENTS

| | | | |
|---|---|---|---|
| 9,772,428 B2 | 9/2017 | Asrani | |
| 2015/0095198 A1* | 4/2015 | Eramian | G06Q 50/30 |
| | | | 705/26.64 |
| 2015/0351073 A1* | 12/2015 | Ball | H04W 4/021 |
| | | | 455/414.2 |
| 2019/0277647 A1* | 9/2019 | Adetola | B60H 1/00771 |

OTHER PUBLICATIONS

"Detecting and communicating environmental attributes derived in real time from cell phones and overlaid on a map", IP.com Disclosure No. IPCOM000200692D, Oct. 25, 2010, 1 page (Abstract Only).

"Method and System for Providing Weather Forecast for a User's Outdoor Activity and Travel Planning", IP.Com Disclosure No. IPCOM000249787D, Apr. 5, 2017, 1 page (Abstract & Description Only).

* cited by examiner

US 10,785,603 B2

DETERMINING LOCATIONS BASED ON DYNAMIC ENVIRONMENTAL CHARACTERISTICS AND USER DATA

BACKGROUND

The present application relates generally to an improved data processing apparatus and method and more specifically to mechanisms for determining locations based on dynamic environmental characteristics and user data.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method is provided in a data processing system comprising at least one processor and at least one memory, the at least one memory comprising instructions that are executed by the at least one processor to cause the at least one processor to be configured to implement a location identification mechanism to identify a location or route for a user. The method comprises identifying, by a location identification engine of the location identification mechanism, a starting location of the user in response to receiving a set of details from the user including at least a target location. The method also comprises generating, by a three-dimensional model generator of the location identification mechanism, a three-dimensional model of an area around the starting location, an area around the target location, and an area between the starting location and the target location. Additionally, the method comprises identifying, by a weather identification engine of the location identification mechanism, current local weather and forecasted local weather associated with the starting location, the target location, and the area between the starting location and the target location. Moreover, the method comprises simulating, by a simulation engine of the location identification mechanism, anticipated wind flow and temperatures within the generated three-dimensional model. Further the method comprises identifying, by a location/route identification engine of the location identification mechanism, a route from the starting location to the target location that meets a set of personal preferences of the user. Still further the method comprises presenting, by a mapping overlay engine of the location identification mechanism, the identified route on a user-selected navigation application associated with the data processing system.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
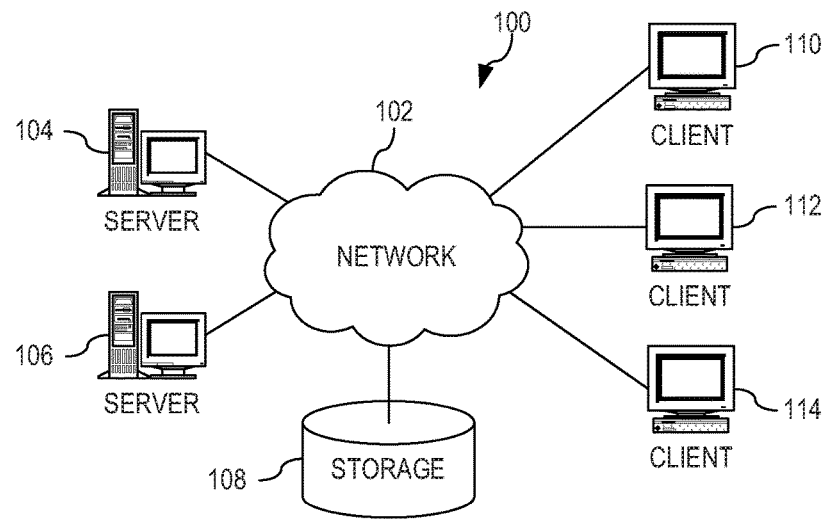
FIG. 1 is an example diagram of a distributed data processing system in which aspects of the illustrative embodiments may be implemented.

Again, urban areas are congested with large buildings, skyscrapers, commercial properties, and the like, which are further surrounded by streets, concrete walkways, parking lots, and the like. People who live, work, and play in these urban areas have to make their way from one location to another, which often involves making their way through extremely hot or cold areas, areas where the tall buildings or skyscrapers cause the wind to blow more turbulently, areas where ice and snow do not melt due to being in the shadow of the tall buildings or skyscrapers, or the like. Unless a user is a local resident or a frequent visitor to these urban areas, knowing where the route is to get from one place to another or what the best places are to have a picnic may be impossible.

In order to determine locations based on dynamic environmental characteristics and user data so that a user may move from one place to another, have a picnic, or the like, the illustrative embodiments provide mechanisms that utilize three-dimensional city wind flow models and weather information, to identify an optimal location to walk, sit, run, bike, picnic, or the like, in an urban environment. The mechanisms generate a three-dimensional model of the urban environment that identifies wind flow patterns for the urban environment that takes into consideration one or more urban structures, such as tall buildings, skyscrapers, commercial properties, and the like. This three-dimensional model is then combined with one or more of current local weather conditions, forecasted local weather conditions, the time of day and resulting sun/shade areas due to the urban structures, as well as personal preferences of the user, such as whether the user is walking, biking, running, or the like; whether the user is looking for a place to sit, have a picnic, laydown, or the like; whether the user likes sunny areas, shaded areas, or the like; as well as other personal preferences.

The mechanisms of the illustrative embodiments then generate a digital simulation of the microclimates within the urban environment for the particular activity that the user is targeting. The digital simulation identifies the zones given the three-dimensional model of wind flow patterns, current local weather conditions, forecasted local weather conditions, the time of day and resulting sun/shade areas due to the urban structures, as well as personal preferences of the user. The mechanisms then overlay the identified zones onto any two-dimensional or three-dimensional mapping tool so that the user may see an optimal location, route, or the like for the particular activity the user is targeting. Thus the illustrative embodiment provides an improvement to current technologies used to determine locations based on dynamic environmental characteristics and user data so that a user may move from one place to another, have a picnic, or the like.

That is, the functionality or capability of computing systems is improved by determining locations based on dynamic environmental characteristics and user data so that a user may move from one place to another, have a picnic, or the like. Current systems do not take into consideration wind flow patterns, current local weather conditions, forecasted local weather conditions, the time of day and resulting sun/shade areas due to the urban structures, as well as personal preferences of the user. By providing the location identification mechanism of the illustrative embodiments that take into account wind flow patterns, current local weather conditions, forecasted local weather conditions, the time of day and resulting sun/shade areas due to the urban structures, as well as personal preferences of the user, the user's experience is improved.

The technical solution provided by the present invention cannot be performed in the human mind or by a human using a pen and paper. That is, the technical solution provided by the present invention could not be accomplished in the human mind or by a human using a pen and paper in any reasonable amount of time and with any reasonable expectation of accuracy without the use of a computer.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a", "at least one of", and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Moreover, it should be appreciated that the use of the term "engine," if used herein with regard to describing embodiments and features of the invention, is not intended to be limiting of any particular implementation for accomplishing and/or performing the actions, steps, processes, etc., attributable to and/or performed by the engine. An engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular engine is, unless otherwise specified, for purposes of convenience of reference and not intended to be limiting to a specific implementation. Additionally, any functionality attributed to an engine may be equally performed by multiple engines, incorporated into and/or combined with the functionality of another engine of the same or different type, or distributed across one or more engines of various configurations.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 2:
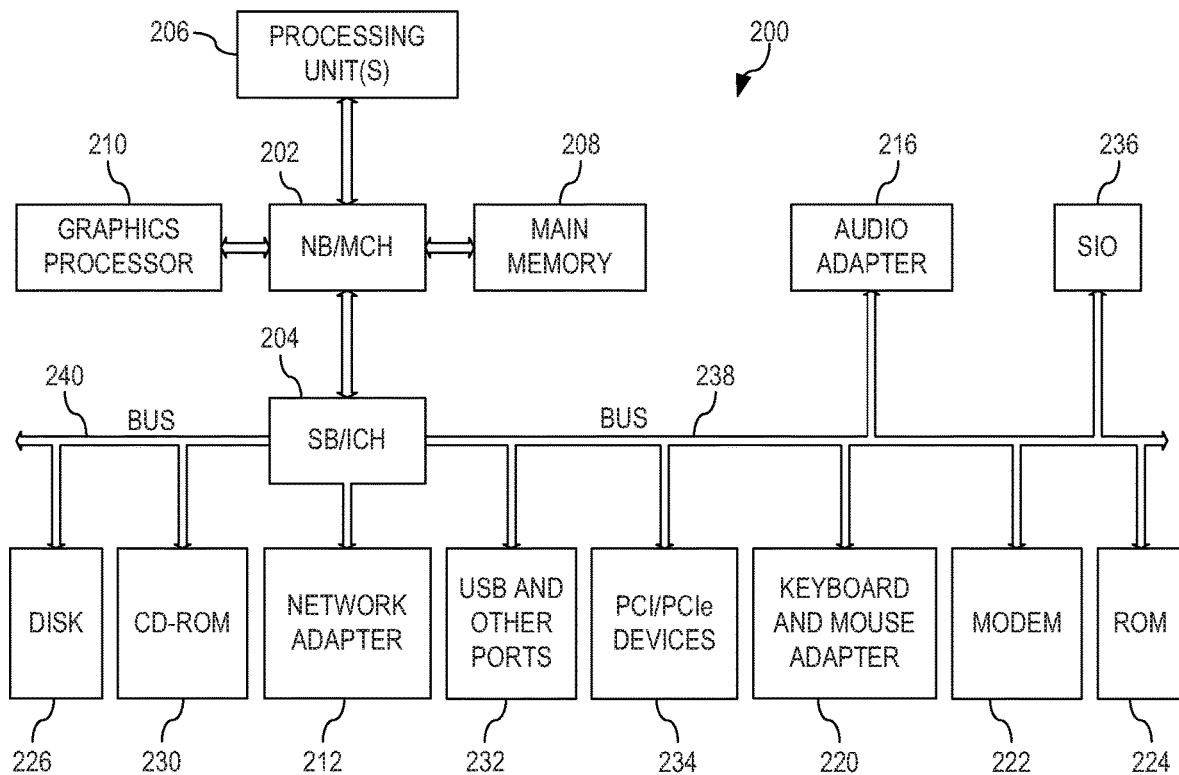
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

As shown in FIG. 1, one or more of the computing devices, e.g., server 104 may be specifically configured to implement a location identification mechanism for determining locations in a city using three-dimensional city wind flow models, weather information, personal preferences, or the like. The configuring of the computing device may comprise the providing of application specific hardware, firmware, or the like to facilitate the performance of the operations and generation of the outputs described herein with regard to the illustrative embodiments. The configuring of the computing device may also, or alternatively, comprise the providing of software applications stored in one or more storage devices and loaded into memory of a computing device, such as server 104, for causing one or more hardware processors of the computing device to execute the software applications that configure the processors to perform the operations and generate the outputs described herein with regard to the illustrative embodiments. Moreover, any combination of application specific hardware, firmware, and software applications executed on hardware, or the like, may be used without departing from the spirit and scope of the illustrative embodiments.

It should be appreciated that once the computing device is configured in one of these ways, the computing device becomes a specialized computing device specifically configured to implement the mechanisms of the illustrative embodiments and is not a general purpose computing device. Moreover, as described hereafter, the implementation of the mechanisms of the illustrative embodiments improves the functionality of the computing device and provides a useful and concrete result that facilitates determining locations in a city using three-dimensional city wind flow models, weather information, personal preferences, or the like.

As noted above, the mechanisms of the illustrative embodiments utilize specifically configured computing devices, or data processing systems, to perform the operations for determining locations in a city using three-dimensional city wind flow models, weather information, personal preferences, or the like. These computing devices, or data processing systems, may comprise various hardware elements which are specifically configured, either through hardware configuration, software configuration, or a combination of hardware and software configuration, to implement one or more of the systems/subsystems described herein. FIG. 2 is a block diagram of just one example data processing system in which aspects of the illustrative embodiments may be implemented. Data processing system 200 is an example of a computer, such as server 104 in FIG. 1, in which computer usable code or instructions implementing the processes and aspects of the illustrative embodiments of the present invention may be located and/or executed so as to achieve the operation, output, and external effects of the illustrative embodiments as described herein.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM eServer™ System P® computer system, Power™ processor based computer system, or the like, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

As mentioned above, in some illustrative embodiments the mechanisms of the illustrative embodiments may be implemented as application specific hardware, firmware, or the like, application software stored in a storage device, such as HDD 226 and loaded into memory, such as main memory 208, for executed by one or more hardware processors, such as processing unit 206, or the like. As such, the computing device shown in FIG. 2 becomes specifically configured to implement the mechanisms of the illustrative embodiments and specifically configured to perform the operations and generate the outputs described hereafter with regard to the location identification mechanism.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the computing system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system tiles and/or user-generated data, for example. Essentially, data processing system 200 may be any known or later developed data processing system without architectural limitation.

Figure 3:
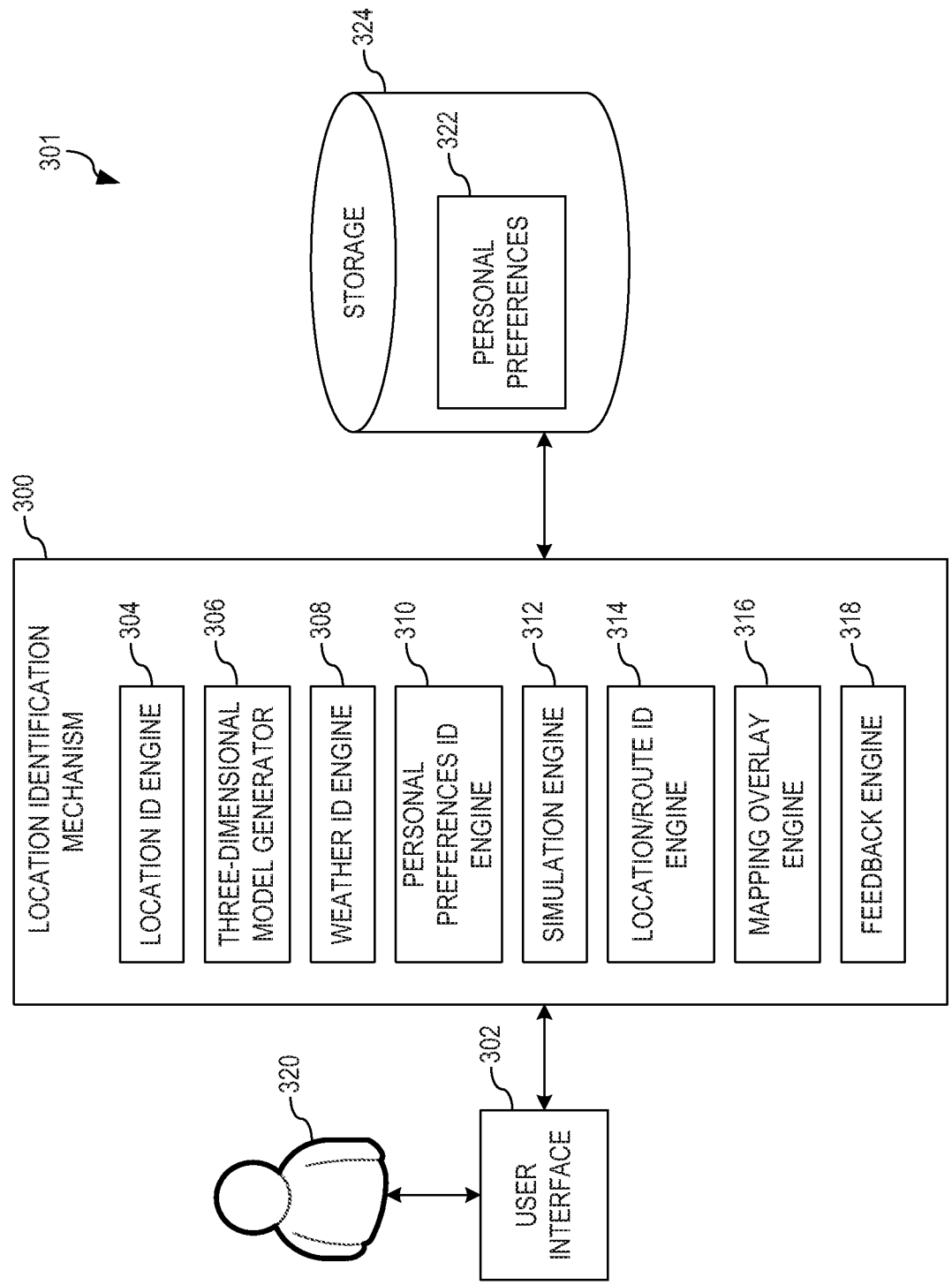
FIG. 3 depicts a functional block diagram of a location identification mechanism for determining a location or route in a city using three-dimensional city wind flow models, weather information, personal preferences, or the like, in accordance with an illustrative embodiment.

FIG. 3 depicts a functional block diagram of a location identification mechanism for determining a location or route in a city using three-dimensional city wind flow models, weather information, personal preferences, or the like, in accordance with an illustrative embodiment. Location identification mechanism 300, which is within data processing system 301, comprises user interface 302, location identification engine 304, three-dimensional model generator 306, weather identification engine 308, personal preferences identification engine 310, simulation engine 312, location/route identification engine 314, mapping overlay engine 316, and feedback engine 318. In order to determine a location or route that meets user's 320 target activity, user 320 identifies one or more details via user interface 302, such as a target location, whether the user will be walking, biking, running, or the like, as well as any other pertinent details of the target activity, such as whether the user is looking for a place to sit, have a picnic, laydown, or the like.

Upon receiving the target activity, location identification engine 304 identities a starting location of user 320 via one or more location systems, such as though global positioning. Using the starting location and the target location, three-dimensional model generator 304 generates a three-dimensional model of the areas around the starting location, the target location, and an area between the starting location and the target location. The three-dimensional model of the area includes buildings, commercial structures, apartments, parking lots, parks, sidewalks, streets, trees, or the like. Using the starting location and the target location, weather identification engine 308 identifies both current local weather and forecasted local weather associated with the starting location, the target location, and the area between the starting location and the target location. Further, personal preferences identification engine 310 identifies one or more personal preferences of user 320, such as whether the user likes sunny areas, shaded areas, or the like; as well as other personal preferences.

With the generated three-dimensional model of the areas, the identified current local weather and forecasted local weather, and the identified personal preferences, simulation engine 312 runs a simulation of the anticipated wind flow and temperatures as it pertains to the generated three-dimensional model, identifying areas such as, those where wind tunnels may occur between buildings, downdraught effects, wind velocities, or the like, as well as what effect on the temperature, such wind flows have. Simulation engine 312 further identifies areas where the temperature may be hotter or colder due to the exposures or shading caused by of buildings, the position of the sun at the current time of day, or the like. Further, simulation engine may utilize one or more positions of the sun for the time it would take to move from the starting location to the target location in order to identify where the sun may shine in user's 320 face, areas where user 320 will be in the shade or dark, or how long be before the sun will set or rise. Thus, simulation engine 312 identifies a microclimate describing the "feel" temperatures of the various routes from the starting location to the target location. In order to improve the quality of the simulation, simulation engine 312 may access actual measurements from various sensors in the para of the starting location, the target location and the area between the starting location and the target location, such as temperature sensors, wind-speed detectors, wind-direction detectors, or the like. Simulation engine 312 may also take into consideration surface area influences, such as concrete sidewalks, concrete or asphalt streets and parking lots, grassy areas, or the like.

Once simulation engine 312 has completed all simulations, location/route identification engine 314 identifies a route from the starting location to the target location that meets the personal preferences of user 320. It should be noted that the route may not be the most direct route from the starting location to the target location, but is a route that would get user 320 from the starting location to the target location while meeting user's 320 preferences with regard to sunny areas, shaded areas, or the like. Once location/route identification engine 314 determines a route, mapping overlay engine 316 interacts with a user selected navigation application associated with data processing system 301 to visually illustrate the route from the starting location to the target location.

Finally, as user 320 navigates to the target location, location identification mechanism 300 monitors the route taken by user 302 and continually updates the most route for user 320 to take based on any variances from the initially determined route that user 320 may take, any changes in the local weather, or any other variables associated with a current location, the target location, and the area between the current location and the target location. Further, if the user changes routes during a current navigation, feedback engine 318 may identify current conditions associated with the selected route and utilize those conditions as personal preferences in future simulations, i.e. learning from actual measurements of the route user 320 navigated during the current navigation, which are stored as personal preferences 322 in storage 324.

While this description is based on an urban environment, the illustrative embodiments are not limited to only these environments. That is, location identification mechanism 300 could be utilized in mountain environments where trees, mountains, valleys, or the like, provide the same wind, temperatures, shading, or the like, issues as exist in the urban environment. Still further, using utilizing law enforcement statistics, simulation engine 312 could also identify safer routes to navigate from the starting location to the target location.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 4:
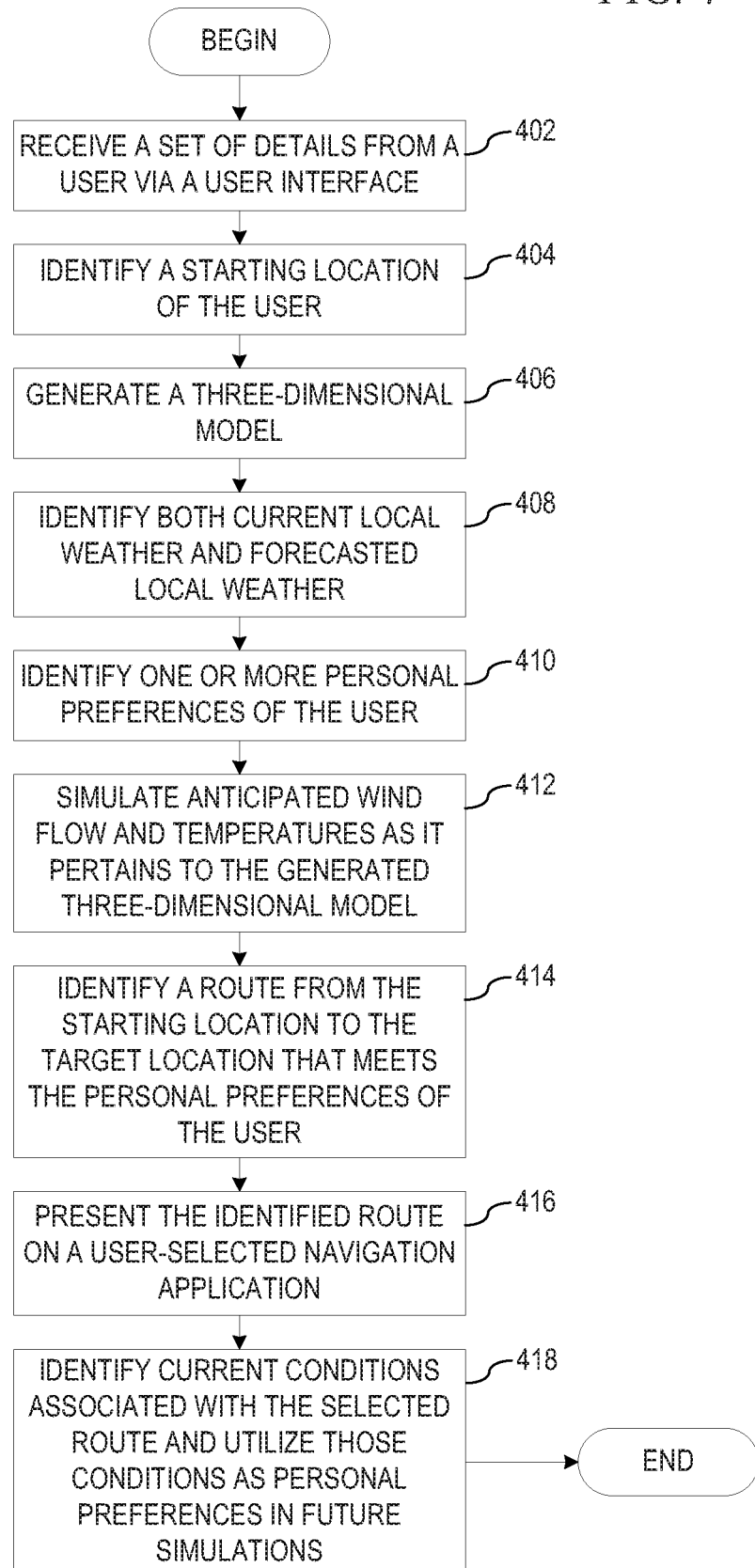
FIG. 4 depicts an exemplary flowchart of the operation performed by a location identification mechanism in determining a location or route in a city using three-dimensional city wind flow models, weather information, personal preferences, or the like, in accordance with an illustrative embodiment.

FIG. 4 depicts an exemplary flowchart of the operation performed by a location identification mechanism in determining a location or route in a city using three-dimensional city wind flow models, weather information, personal preferences, or the like, in accordance with an illustrative embodiment. As the operation begins, the location identification mechanism receives a set of details from a user via a user interface (step 402). The set of details being, for example, a target location, whether the user will be walking, biking, running, or the like, as well as any other pertinent details of the target activity, such as whether the user is looking for a place to sit, have a picnic, laydown, or the like. Upon receiving the target activity, a location identification engine of the location identification mechanism identifies a starting location of the user (step 404) via one or more location systems, such as though global positioning. Using the starting location and the target location, a three-dimensional model generator of the location identification mechanism generates a three-dimensional model of the areas around the starting location, the target location, and an area between the starting location and the target location (step 406). The three-dimensional model of the area includes buildings, commercial structures, apartments, parking lots, parks, sidewalks, streets, trees, or the like. Using the starting location and the target location, a weather identification engine of the location identification mechanism identifies both current local weather and forecasted local weather associated with the starting location, the target location, and the area between the starting location and the target location (step 408). Further, a personal preferences identification engine of the location identification mechanism identifies one or more personal preferences of the user (step 410), such as whether the user likes sunny areas, shaded areas, or the like; as well as other personal preferences.

With the generated three-dimensional model of the areas, the identified current local weather and forecasted local weather, and the identified personal preferences, a simulation engine of the location identification mechanism runs a simulation of the anticipated wind flow and temperatures as it pertains to the generated three-dimensional model (step 412), identifying areas such as, those where wind tunnels may occur between buildings, downdraught effects, wind velocities, or the like, as well as what effect on the temperature, such wind flows have. The simulation engine may further identify areas where the temperature may be hotter or colder due to the exposures or shading caused by of buildings, the position of the sun at the current time of day, or the like. Thus, the simulation engine identifies a microclimate describing the "feel" temperatures of the various routes from the starting location to the target location. In order to improve the quality of the simulation, the simulation engine may access actual measurements from various sensors in the para of the starting location, the target location and the area between the starting location and the target location, such as temperature sensors, wind-speed detectors, wind-direction detectors, or the like. The simulation engine may also take into consideration surface area influences, such as concrete sidewalks, concrete or asphalt streets and parking lots, grassy areas, or the like.

Once the simulation engine has completed all simulations, a location/route identification engine of the location identification mechanism identifies a route from the starting location to the target location that meets the personal preferences of the user (step 414). It should be noted that the route may not be the most direct route from the starting location to the target location, but is a route that would get the user from the starting location to the target location while meeting the user's personal preferences with regard to sunny areas, shaded areas, or the like. Once the location/route identification engine determines a route, a mapping overlay engine of the location identification mechanism interacts with a user selected navigation application associated with the data processing system in which the location identification mechanism operates to visually illustrate the route from the starting location to the target location (step 416).

Finally, as the user navigates to the target location, the location identification mechanism monitors the route taken by the user and continually updates the most route for the user to take based on any variances from the initially determines route that the user may take, any changes in the local weather, or any other variables associated with a current location, the target location and the area between the current location and the target location. Further, if the user changes routes during a current navigation, a feedback engine of the location identification mechanism may identify current conditions associated with the selected route and utilize those conditions as personal preferences in future simulations (step 418), i.e. learning from actual measurements of the route the user navigated during the current navigation.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Thus, the illustrative embodiments provide mechanisms for identifying an optimal location to walk, sit, run, bike, picnic, or the like, in an urban environment. The mechanisms generate a three-dimensional model of the urban environment that identifies wind flow patterns for the urban environment that takes into consideration one or more urban structures, such as tall buildings, skyscrapers, commercial properties, and the like. This three-dimensional model is then combined other one or more of current local weather conditions, forecasted local weather conditions, the time of day and resulting sun/shade areas due to the urban structures, as well as personal preferences of the user, such as whether the user is walking, biking, running, or the like; whether the user is looking for a place to sit, have a picnic, laydown, or the like; whether the user likes sunny areas, shaded areas, or the like; as well as other personal preferences.

The mechanisms of the illustrative embodiments then generate a digital simulation of the microclimates within the urban environment for the particular activity that the user is targeting. The digital simulation identifies the most zones given the three-dimensional model of wind flow patterns, current local weather conditions, forecasted local weather conditions, the time of day and resulting sun/shade areas due to the urban structures, as well as personal preferences of the user. The mechanisms then overlay the identified zones onto any two-dimensional or three-dimensional mapping tool so that the user may see an optimal location, route, or the like for the particular activity the user is targeting. Thus the illustrative embodiment provide an improvement to current technologies used to determine locations based on dynamic environmental characteristics and user data so that a user may move from one place to another, have a picnic, or the like.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a communication bus, such as a system bus, for example. The memory elements can include local memory employed during actual execution of the program code, bulk storage, and cache memories which provide temporary storage of at least some program code in order to reduce the number of times code must be retrieved from bulk storage during execution. The memory may be of various types including, but not limited to, ROM, PROM, EPROM, EEPROM, DRAM, SRAM, Flash memory, solid state memory, and the like.

Input/output or I/O devices (including but not limited to keyboards, displays, pointing devices, etc.) can be coupled to the system either directly or through intervening wired or wireless I/O interfaces and/or controllers, or the like. I/O devices may take many different forms other than conventional keyboards, displays, pointing devices, and the like, such as for example communication devices coupled through wired or wireless connections including, but not limited to, smart phones, tablet computers, touch screen devices, voice recognition devices, and the like. Any known or later developed I/O device is intended to be within the scope of the illustrative embodiments.

Network adapters may also be coupled to the system to enable the data processing system to become coupled to other data processing systems or remote printers or storage devices through intervening private or public networks. Modems, cable modems and Ethernet cards are just a few of the currently available types of network adapters for wired communications. Wireless communication based network adapters may also be utilized including, but not limited to, 802.11 a/b/g/n wireless communication adapters, Bluetooth wireless adapters, and the like. Any known or later developed network adapters are intended to be within the spirit and scope of the present invention.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system comprising at least one processor and at least one memory, the at least one memory comprising instructions that are executed by the at least one processor to cause the at least one processor to be configured to implement a location identification mechanism to identify a location or route for a user, the method comprising responsive to receiving a set of details from the user including at least a target location, identifying, by a location identification engine of the location identification mechanism, a starting location of the user;

generating, by a three-dimensional model generator of the location identification mechanism, a three-dimensional model of an area around the starting location, an area around the target location, and an area between the starting location and the target location;

identifying, by a weather identification engine of the location identification mechanism, current local weather and forecasted local weather associated with the starting location, the target location, and the area between the starting location and the target location;

simulating, by a simulation engine of the location identification mechanism, anticipated wind flow and temperatures within the generated three-dimensional model, wherein the simulation identifies the anticipated wind flow by identifying areas where wind tunnels may occur between buildings, downdraught effects caused by the buildings, and wind velocities around the buildings, and wherein the simulation identifies the temperatures by identifying the effect on the temperature by the anticipated wind flows, exposures or shading caused by the buildings, and a position of the sun at a current time of day;

identifying, by a location/route identification engine of the location identification mechanism, a route from the starting location to the target location based on the current local weather and the forecasted local weather associated with the starting location, the target location, and the area between the starting location and the target location; the anticipated wind flow and the temperatures within the generated three-dimensional model; and a set of personal preferences of the user; and presenting, by a mapping overlay engine of the location identification mechanism, the identified route on a user-selected navigation application associated with the data processing system.

2. The method of claim 1, further comprising:

monitoring, by the location identification mechanism, the user's movements from the starting location to the target location; and responsive to the user deviating from the identified route, generating, by the location identification mechanism, a new route from a current location to the target location based on the current local weather and the forecasted local weather associated with the starting location, the target location, and the area between the starting location; and the target location; the anticipated wind flow and the temperatures within the generated three-dimensional model; and the set of personal preferences of the user.

3. The method of claim 1, further comprising:

monitoring, by the location identification mechanism, the user's movements from the starting location to the target location;

responsive to the user deviating from the identified route, identifying, by a feedback engine of the location identification mechanism, current conditions associated with a new route; and utilizing, by the feedback engine, the identified conditions as personal preferences in future simulations.

4. The method of claim 1, wherein the set of details further includes an identification of an activity the user will be using to move from the starting location to the target location.

5. The method of claim 1, wherein the set of details includes an identification of an activity the user will be performing once the target location is reached.

6. The method of claim 1, wherein the three-dimensional model includes one or more from the group consisting of the buildings, commercial structures, apartments, parking lots, parks, sidewalks, streets, and trees.

\* \* \* \* \*